(12) United States Patent  
Hijikata et al.

(10) Patent No.: US 7,816,990 B2  
(45) Date of Patent: Oct. 19, 2010

(54) VARIABLE GAIN AMPLIFICATION CIRCUIT

(75) Inventors: Katsumasa Hijikata, Takatsuki (JP); Joji Hayashi, Hirakata (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 10/800,716

(22) Filed: Mar. 16, 2004

(65) Prior Publication Data

US 2004/0212741 A1    Oct. 28, 2004

(30) Foreign Application Priority Data

Mar. 17, 2003   (JP)   ............................. 2003-072548

(51) Int. Cl.
*H03G 3/10* (2006.01)
(52) U.S. Cl. ................ 330/279; 330/302; 330/305; 327/359; 327/581; 455/234.1
(58) Field of Classification Search ........... 327/359, 327/581, 566, 560, 553; 330/278, 279, 302, 330/305, 306, 303, 129, 254; 257/312, 595, 257/598, 600, 601; 361/277, 278, 280, 281; 455/234.1, 245.1, 232.1, 208, 266, 340, 182.3
See application file for complete search history.

(56) References Cited

U.S. PATENT DOCUMENTS

| | | | | |
|---|---|---|---|---|
| 3,541,451 A | * | 11/1970 | Lind | ........................ 455/208 |
| 4,758,794 A | * | 7/1988 | Ogawa | ........................ 329/344 |
| 5,280,641 A | * | 1/1994 | Ishii et al. | ................. 455/182.3 |
| 5,463,285 A | * | 10/1995 | El-Hamamsy | ............... 315/248 |
| 5,914,513 A | * | 6/1999 | Shenai et al. | ................ 257/312 |
| 6,242,963 B1 | | 6/2001 | Su et al. | |
| 6,424,222 B1 | | 7/2002 | Jeong et al. | |

FOREIGN PATENT DOCUMENTS

| | | |
|---|---|---|
| JP | 54-070755 | 6/1979 |
| JP | 57-007604 | 1/1982 |
| JP | 62-119012 | 7/1987 |
| JP | 04-343504 | 11/1992 |
| JP | 06170368 | * 6/1994 |
| JP | 6-310953 | 11/1994 |
| JP | 08256039 A | 10/1996 |
| JP | 09-205382 | 8/1997 |
| JP | 10-13280 | 1/1998 |
| JP | 10-209901 | 8/1998 |
| JP | 11-289229 | 10/1999 |
| JP | 2000-101353 | 4/2000 |
| JP | 2000-323944 | 11/2000 |
| JP | 2002-94345 | 3/2002 |

* cited by examiner

*Primary Examiner*—Michael B Shingleton
(74) *Attorney, Agent, or Firm*—Wenderoth, Lind & Ponack, L.L.P.

(57) ABSTRACT

A variable gain amplification circuit comprises a signal generator that has an output terminal and is able to vary an output amplitude; a variable capacitor connected between the output terminal and an AC grounded terminal; and a control circuit for controlling the output amplitude of the signal generator, and a capacitance of the variable capacitor. Therefore, unnecessary signals can be attenuated even when the gain is low, and degradation in distortion characteristics in the latter block can be suppressed.

8 Claims, 10 Drawing Sheets

VARIABLE GAIN AMPLIFICATION CIRCUIT

FIELD OF THE INVENTION

The present invention relates to broad-band radio communication devices such as a BS/CS tuner for digital television and, more particularly, to a variable gain amplification circuit included in a reception system that is required to have low distortion characteristics.

BACKGROUND OF THE INVENTION

Since the start of digital television broadcasting in December 2000, demand for digital television BS/CS tuners has been increasing year after year.

However, an existing BS/CS tuner system is constituted by plural parts such as chips and filters, leading to high cost. In order to realize cost reduction, it is important to reduce the number of parts by fabricating the system on one chip, and currently, development of such one-chip tuner system is actively carried out.

In the specification of the digital television BS/CS tuner, the tuner must receive about 20 channels of signals within a broad band ranging from 1 GHz to 2.6 HGz, and detect and demodulate only a desired channel without distortion. In the development of the one-chip tuner system, not only a high-performance external filter that suppresses degradation in distortion characteristics due to an interference wave such a signal from another channel but also an on-chip filter that is lower in performance than the external filter are used, and therefore, lower distortion characteristics are required of the reception unit.

Usually, in a radio communication receiver, two methods as follows are carried out to suppress degradation in distortion characteristics.

One is adding a variable gain function to a mixer or amplifier in a reception unit. In this case, an appropriate output level can be maintained regardless of an input signal level, whereby degradation in distortion characteristics of a latter block at large signal input can be suppressed.

There are various methods for realizing such variable gain function, and one of them includes connecting a variable resistor between source terminals of a pair of differential input transistors in a differential amplifier circuit, and controlling an amount of feedback of the amplifier circuit according to the resistance. Further, there is another method described in, for example, Japanese Published Patent Application No. Hei. 8-256039 (pages 1-7, FIG. 1). In this method, a variable resistor is constituted by two variable resistors connected in series, each using a channel resistance between a source and a drain of a MOS transistor, and an appropriate bias voltage is applied to a node of the two MOS transistors to feed a DC current through the node, thereby to operate the variable resistor so as to avoid a point at which the resistance of the channel resistor steeply changes, and thus degradation in distortion characteristics during gain control is suppressed.

The other method is inserting a filter in a reception part as mentioned above. The filter attenuates unnecessary signals such as an interference wave signal and an intermodulation distortion, whereby degradation in distortion characteristics in the later block can be suppressed (for example, refer to "RF CMOS Circuit Design Technique" written by Nobuyuki Ito, Triceps Co. Ltd., June 2002, Pages 12-23).

Furthermore, an output load part of a mixer or an amplifier may be provided with a filter function. To be specific, a capacitor is connected to an output terminal of a mixer or an amplifier to constitute an LPF (Low Pass Filter) by the output load impedance and the capacitor. Thereby, unnecessary signals such as an interference wave signal and an intermodulation distortion are attenuated, whereby degradation in distortion characteristics of the mixer or amplifier itself or distortion characteristics of the later block can be suppressed.

Hereinafter, a description will be given of a conventional variable gain amplification circuit in which a capacitor for realizing a filter function is connected to an output terminal of a mixer having a variable gain function.

Figure 14:
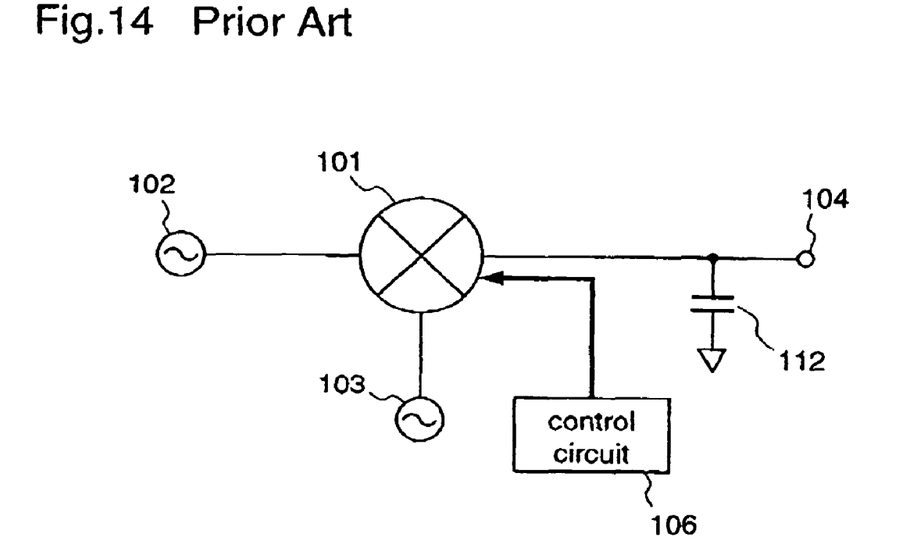
FIG. 14 is a circuit diagram illustrating the conventional variable gain amplification circuit.

FIG. 14 is a diagram illustrating the conventional variable gain amplification circuit, wherein 101 denotes a variable gain mixer using a variable output load impedance, 102 denotes an RF signal source, 103 denotes an LO signal source, 104 denotes an output terminal, 106 denotes a control circuit, and 112 denotes a capacitor.

Hereinafter, a description will be given of the operation of the conventional variable gain amplification circuit constituted as described above. The variable gain mixer 101 multiplies an RF signal supplied from the RF signal source 102 and an LO signal supplied from the LO signal source 103 to frequency-convert the RF signal, and outputs an IF signal to the output terminal 104.

The control circuit 106 controls the gain of the variable gain mixer 101 so as to constantly output an appropriate IF signal level regardless of variations in the RF signal level supplied from the RF signal source 102.

The capacitor 112 has a function of attenuating unnecessary signal components such as an interference wave signal or intermodulation distortion that is included in the IF signal, an RF leakage signal, an LO leakage signal, and the like, and the capacitor 112 is connected to suppress degradation in distortion characteristics.

Hereinafter, the function of suppressing degradation in distortion characteristics, possessed by the capacitor 112, will be described in detail.

Figure 15:
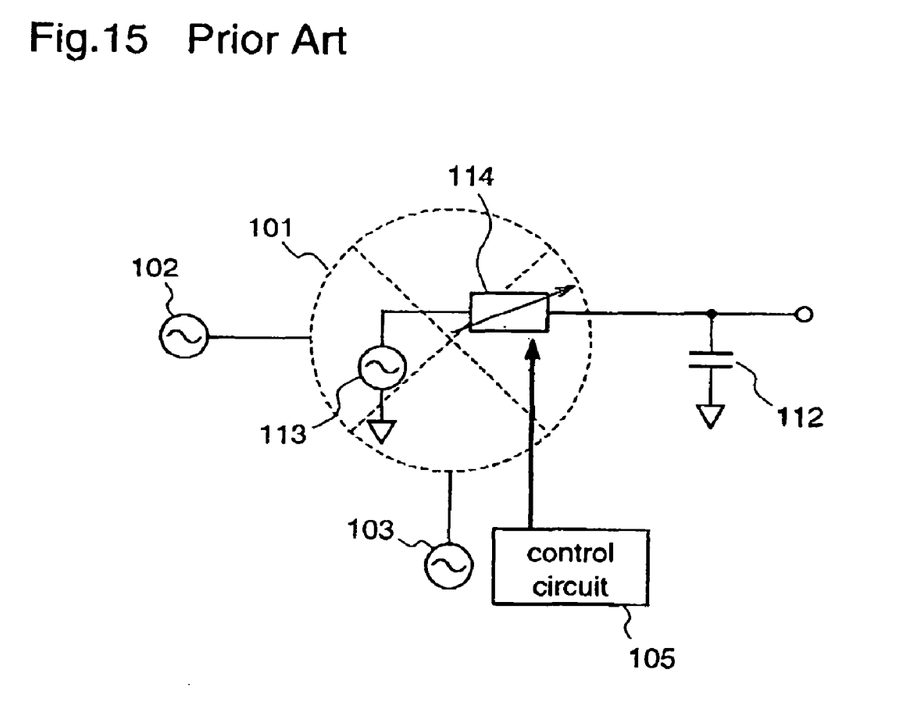
FIG. 15 is an AC equivalent circuit diagram of the conventional variable gain amplification circuit.

FIG. 15 is a diagram illustrating, as an AC equivalent circuit, the variable gain mixer 101 of the conventional variable gain amplification circuit shown in FIG. 14, wherein 113 denotes an IF signal source, and 114 denotes a variable output load impedance.

In FIG. 15, it is apparent that a filter is formed when paying attention to the variable output load impedance 114 and the capacitor 112.

Assuming that the impedance of the variable output load impedance 114 is Z14, and the capacitance of the capacitor 112 is C12, a transfer function A of the filter viewed from the IF signal source 113 is expressed by formula (1) as follows.

$$A = \frac{1}{1 + j \cdot \omega \cdot C12 \cdot Z14} \quad (1)$$

First of all, a description will be given of the case where the variable output load impedance 114 is a variable resistor, that is, the variable gain mixer 101 uses a variable resistor in the output load part.

Figure 16:
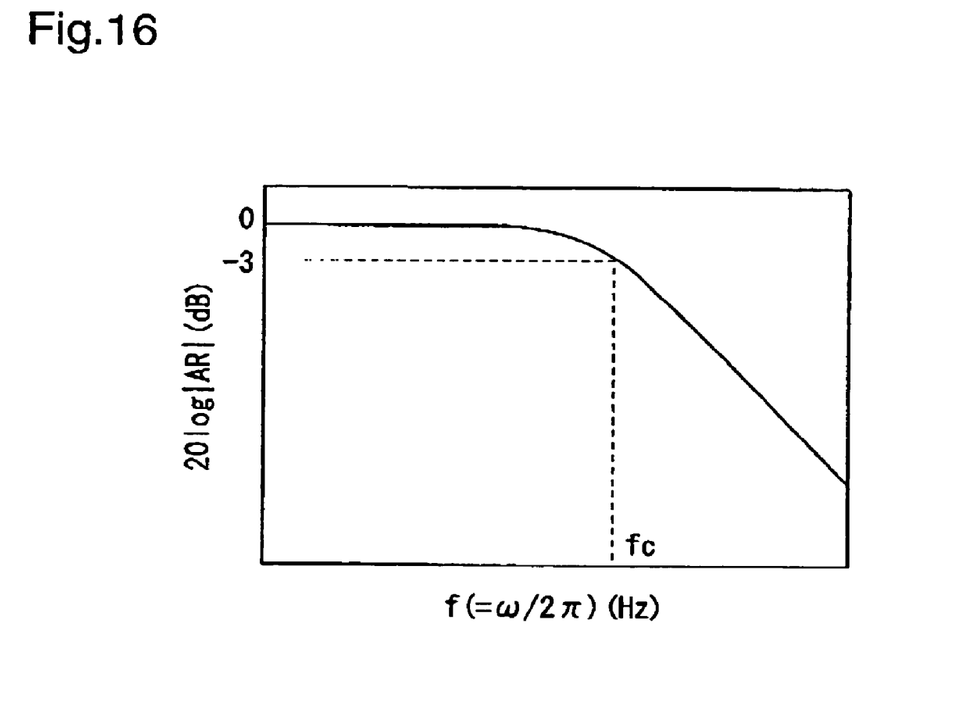
FIG. 16 is a diagram illustrating frequency characteristics of a primary LPF.

Assuming that the resistance of the variable output load impedance 114 is R14, a transfer function is expressed by formula (2) using formula (1).

$$AR = \frac{1}{1 + j \cdot \omega \cdot C12 \cdot R14} \quad (2)$$

wherein AR is a transfer function of a primary LPF, having frequency characteristics shown in FIG. 16. In FIG. 16, fc is a cutoff frequency that is given by formula (3).

$$fc = \frac{1}{2\pi \cdot C12 \cdot R14} \quad (3)$$

Accordingly, it is possible to attenuate unnecessary signals such as an interference wave signal, an intermodulation distortion, an RF leakage signal, an LO leakage signal by setting the capacitance C12 so that the cutoff frequency fc becomes a maximum frequency that does not attenuate a desired IF signal. As a result, degradation in distortion characteristics can be suppressed.

Next, a description will be given of the case where the variable output load impedance 114 is a variable inductor, that is, the variable gain mixer 101 uses a variable inductor in the output load part.

Figure 17:
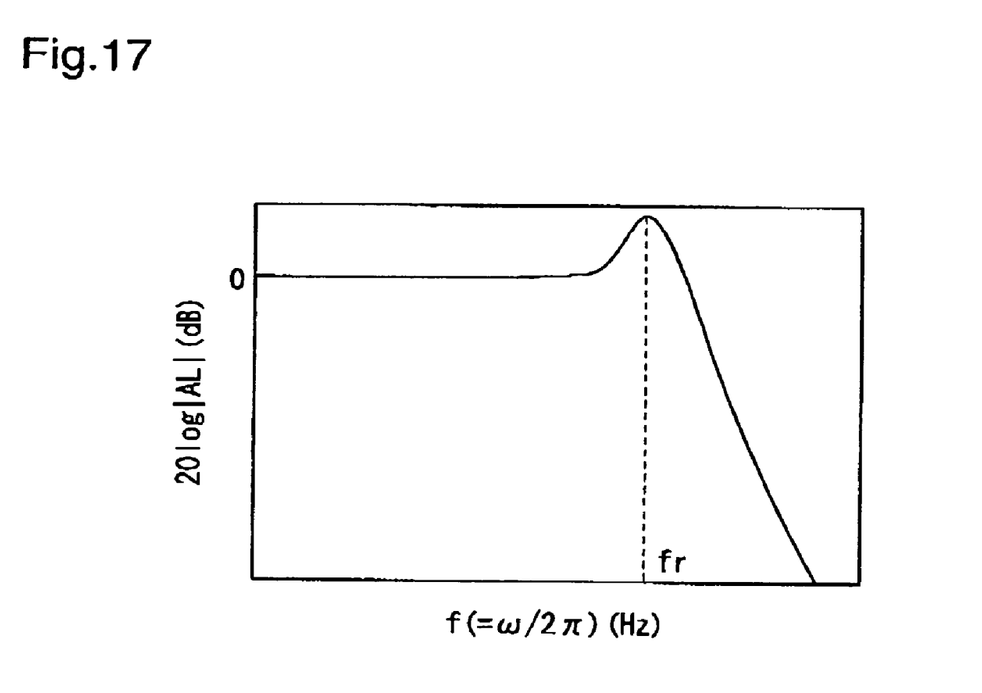
FIG. 17 is a diagram illustrating frequency characteristics of a secondary LPF.

Assuming that the inductance of the variable output load impedance 114 is L14, a transfer function AL is expressed by formula (4) using formula (1).

$$AL = \frac{1}{1 - \omega^2 \cdot C12 \cdot L14} \quad (4)$$

wherein AL is a transfer function of a secondary LPF, having frequency characteristics shown in FIG. 17. In FIG. 17, fr is a resonance frequency that is given by formula (5).

$$fr = \frac{1}{2\pi \sqrt{C12 \cdot L14}} \quad (5)$$

Accordingly, it is possible to attenuate unnecessary signals such as an interference wave signal, an intermodulation distortion, an RF leakage signal, and an LO leakage signal by setting the capacitance C12 so that the cutoff frequency fc becomes a maximum frequency that does not attenuate a desired IF signal. As a result, degradation in distortion characteristics can be suppressed.

However, in the construction of the conventional variable gain amplification circuit shown in FIG. 15, since the variable output load impedance 114 of the variable gain mixer 101 varies during gain control, the cutoff frequency fc or the resonance frequency fr varies, whereby unnecessary signals such as an interference wave signal, an intermodulation distortion, an RF leakage signal, and an LO leakage signal cannot be sufficiently attenuated, resulting in degradation in distortion characteristics of the variable gain mixer 101 or the latter block.

Figure 18:
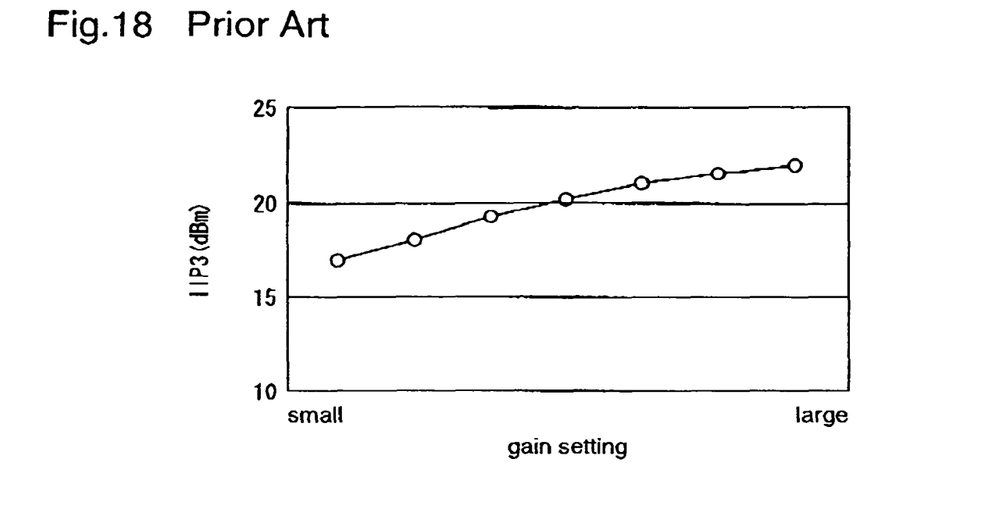
FIG. 18 is a diagram illustrating distortion characteristics against gain setting of the conventional variable gain amplification circuit.

FIG. 18 is a diagram which plots tertiary distortion intercept points (IIP3) against gain setting in the conventional variable gain amplification circuit shown in FIG. 15, representing that the distortion characteristics are degraded at the lower gain side.

When the gain is set low, the control circuit 106 performs control so that the variable output load impedance 114 is lowered. Therefore, the resistance R14 in formula 3 or the inductance L14 in formula 5 is reduced, and the cutoff frequency fc or the resonance frequency fr is increased. As a result, a tertiary intermodulation distortion (IM3) signal that is not required cannot be sufficiently attenuated, resulting in degradation in distortion characteristics at the lower gain side as shown in FIG. 18.

SUMMARY OF THE INVENTION

The present invention is made to solve the above-described problems and has for its object to provide a variable gain amplification circuit that can suppress degradation in distortion characteristics at low gain.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, there is provided a variable gain amplification circuit comprising: a signal generator that has an output terminal and is able to vary an output amplitude; a variable capacitor connected between the output terminal and an AC grounded terminal; and a control circuit for controlling the output amplitude of the signal generator, and a capacitance of the variable capacitor.

According to a second aspect of the present invention, in the variable gain amplification circuit according to the first aspect, the signal generator has a variable resistor at an output load part.

According to a third aspect of the present invention, in the variable gain amplification circuit according to the first aspect, the signal generator has a variable inductor at an output load part.

According to a fourth aspect of the present invention, in the variable gain amplification circuit according to any of the first to third aspects, the signal generator comprises: a variable gain mixer having a first input terminal and a second input terminal; an RF signal source connected to the first input terminal of the variable gain mixer; and an LO signal source connected to the second input terminal of the variable gain mixer.

According to a fifth aspect of the present invention, in the variable gain amplification circuit according to any of the first to third aspects, the signal generator comprises: a variable gain amplifier having a first input terminal; and an RF signal source connected to the first input terminal of the variable gain amplifier.

According to a sixth aspect of the present invention, in the variable gain amplification circuit according to the fourth aspect, the variable gain mixer is a single balanced mixer or a double balanced mixer.

According to a seventh aspect of the present invention, in the variable gain amplification circuit according to the fifth aspect, the variable gain amplifier is a source grounded amplifier.

According to an eighth aspect of the present invention, in the variable gain amplification circuit according to the first aspect, the variable capacitor is constituted by a circuit comprising at least two capacitors placed in parallel between the first terminal and the second terminal, and at least one switch connected to an end of one of said at least two capacitors; and the capacitance between the first terminal and the second terminal is varied by ON/OFF of said at least one switch.

According to a ninth aspect of the present invention, in the variable gain amplification circuit according to the first aspect, the variable capacitor has a capacitor and a MOS device whose gate terminal is connected to the capacitor, between a third terminal and a fourth terminal; and the capacitance between the third terminal and the fourth terminal is varied by a bias voltage supplied to the gate terminal of the MOS device.

According to a tenth aspect of the present invention, in the variable gain amplification circuit according to the second aspect, the variable resistor is constituted by a circuit comprising at least two resistors placed in parallel between the first terminal and the second terminal, and at least one switch connected to an end of one of said at least two resistors; and the resistance between the first terminal and the second terminal is varied by ON/OFF of said at least one switch.

According to an eleventh aspect of the present invention, in the variable gain amplification circuit according to the third aspect, the variable inductor is constituted by a circuit comprising at least two inductors placed in parallel between the first terminal and the second terminal, and at least one switch connected to an end of one of said at least two inductors; and the inductance between the first terminal and the second terminal is varied by ON/OFF of said at least one switch.

According to a twelfth aspect of the present invention, in the variable gain amplification circuit according to any of the first to twelfth aspects, the control circuit controls the variable capacitor so that the cutoff frequency or resonance frequency of the signal generator becomes constant.

According to a thirteenth aspect of the present invention, in the variable gain amplification circuit according to the fourth or fifth aspect, the RF signal source has a signal band equal to or larger than 100 MHz.

According to a fourteenth aspect of the present invention, in the variable gain amplification circuit according to the fourth aspect, the variable gain mixer is a down conversion mixer.

In the variable gain amplification circuit constituted as described above, even when the variable output load impedance of the signal generator, or the variable gain mixer, or the variable gain amplifier varies when controlling the output amplitude or the gain, the cutoff frequency fc or resonance frequency fr of the LPF comprising the variable output load impedance and the variable capacitor can be kept constant by controlling the capacitance of the variable capacitor. As a result, unnecessary signals outside the required frequency band can be attenuated even when the gain is low, whereby degradation in distortion characteristics can be suppressed.

DETAILED DESCRIPTION OF THE PREFERRED EMBODIMENTS

Hereinafter, preferred embodiments of the present invention will be described with reference to the drawings.

Embodiment 1

Figure 1:
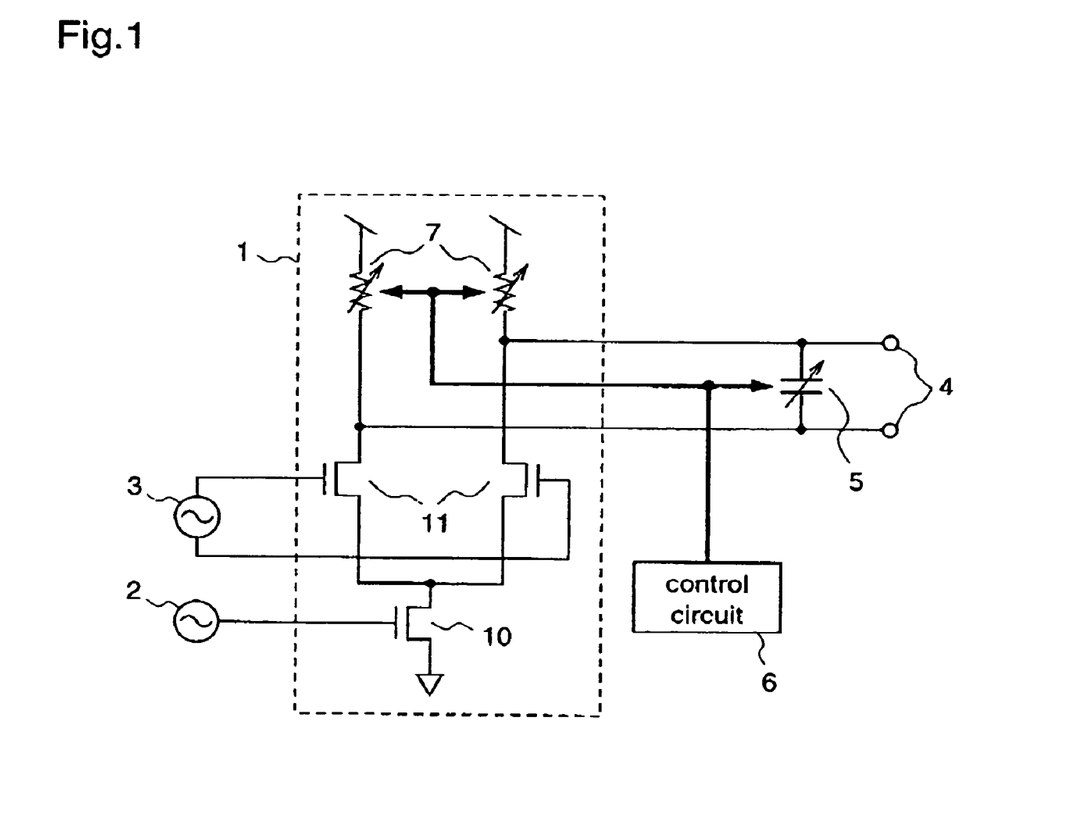
FIG. 1 is a circuit diagram illustrating a variable gain amplification circuit according to a first embodiment of the present invention.

FIG. 1 is a circuit diagram illustrating a variable gain amplification circuit according to the first embodiment of the present invention.

In FIG. 1, reference numeral 1 denotes a variable gain mixer having a first input terminal and a second input terminal, numeral 2 denotes an RF signal source connected to the first input terminal of the variable gain mixer 1, numeral 3 denotes an LO signal source connected to the second input terminal of the variable gain mixer 1, numeral 4 denotes an output terminal, numeral 5 denotes a variable capacitor, and numeral 6 denotes a control circuit for controlling the gain of the variable gain mixer 1 and the capacitance of the variable capacitor 5. In this first embodiment, the variable gain mixer 1 is a down conversion mixer.

Further, the variable gain mixer 1 is a single balanced mixer comprising a variable resistor 7, an RF signal input transistor 10, and an LO signal input transistor 11.

Figure 2:
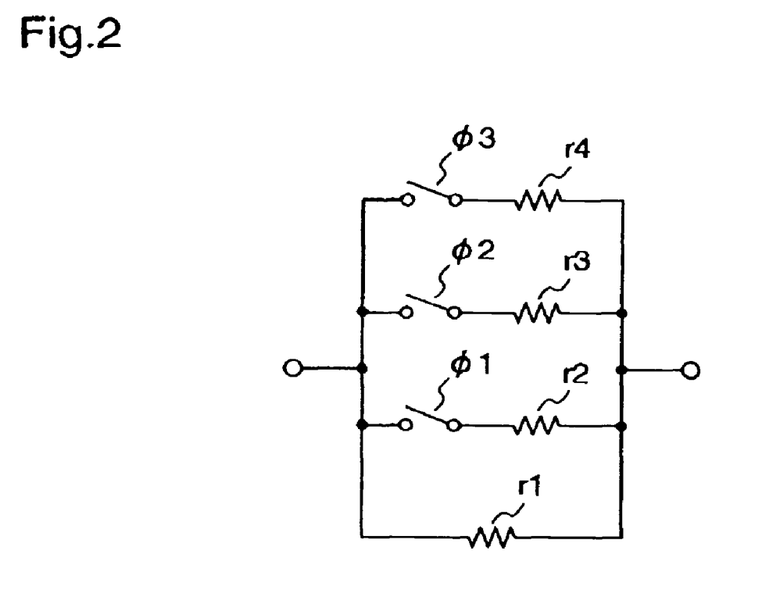
FIG. 2 is a circuit diagram illustrating a variable resistor included in a variable gain amplification circuit according to the first and third embodiments of the present invention.

As shown in FIG. 2, the variable resistor 7 comprises four resistors r1, r2, r3, and r4, and three switches $\phi1$, $\phi2$, and $\phi3$, and the resistance between the terminals can be varied by successively turning on the switches φ1 to φ3.

Figure 3:
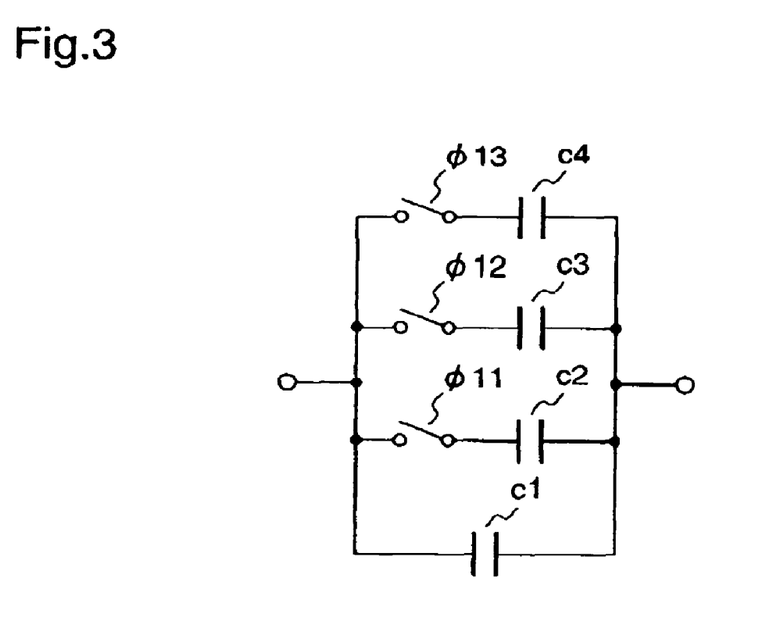
FIG. 3 is a circuit diagram illustrating a variable capacitor included in the variable gain amplification circuit according to the first and third embodiments of the present invention.

Further, as shown in FIG. 3, the variable capacitor 5 comprises four capacitors c1, c2, c3, and c4, and three switches φ1, φ2, and φ3, and the capacitance between the terminals can be varied by successively turning on the switches φ1 to φ3.

Figure 19:
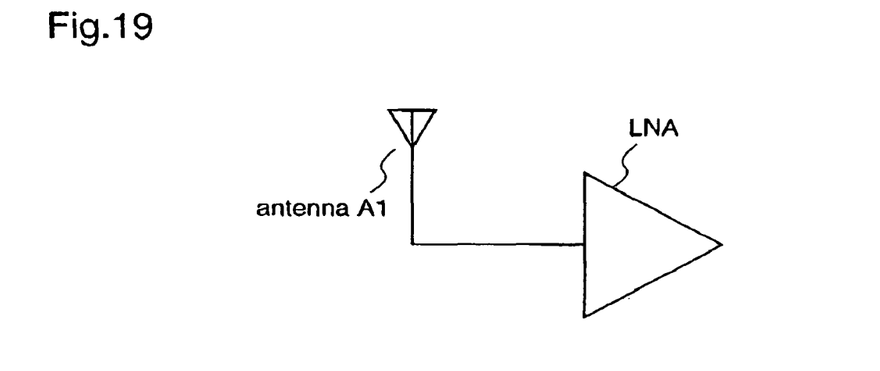
FIG. 19 is a block diagram illustrating an RF signal source according to the first and second embodiments of the present invention.

Further, the RF signal source 2 comprises an antenna A1 and an LNA (Low Noise Amplifier) as shown in FIG. 19, and the LO signal source 3 comprises a PLL (Phase Locked Loop).

Hereinafter, the operation of the variable gain amplification circuit constituted as described above will be described.

The RF signal supplied from the RF signal source 2 to the variable gain mixer 1 is input to the RF signal input transistor 10, and converted from a voltage signal to a current signal.

On the other hand, the differential LO signal supplied from the LO signal source 3 to the variable gain mixer 1 is input to the LO signal input transistor 11, and the LO signal input transistor 11 repeats the switching operation at the frequency of the LO signal.

When the voltage-to-current converted RF signal is input to the LO signal input transistor 11, the RF signal and the LO signal are multiplied. Thereby, the RF signal is frequency-converted to be an IF signal, and the IF signal is converted into a voltage signal by the variable resistor 7, whereby the IF signal appears at the output terminal 9.

The variable gain function of the variable gain mixer 1 is realized by controlling the resistance R7 of the variable resistor 7 by the control circuit 6.

Further, the capacitance C5 of the variable capacitor 5 is controlled by the control circuit 6 so that the cutoff frequency fc of the variable gain mixer 1 becomes constant, in synchronization with the variable resistor 7.

Next, the effect of the variable gain amplification circuit according to the first embodiment will be described in comparison with the conventional variable gain amplification circuit.

Figure 4:
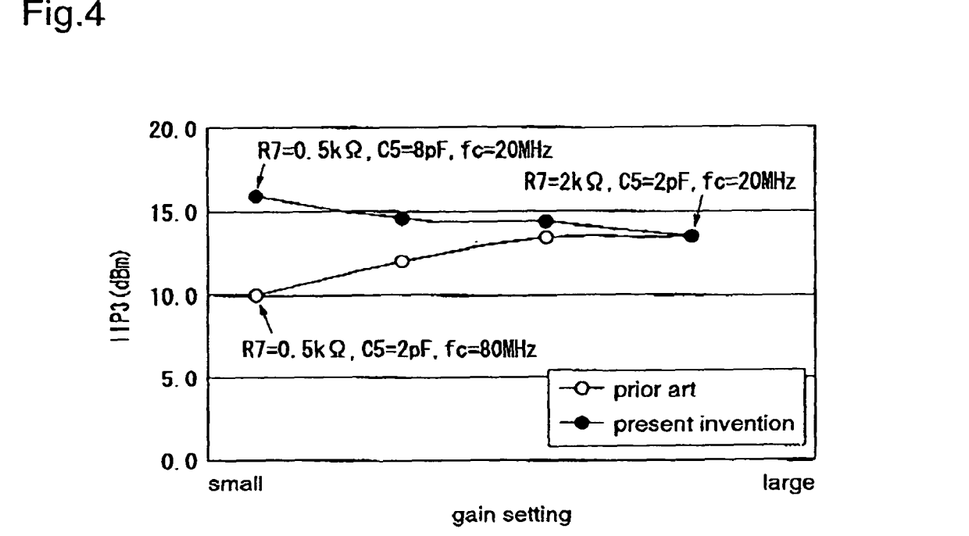
FIG. 4 is a diagram for explaining the effect of the variable gain amplification circuit according to the first embodiment of the present invention.

FIG. 4 is a diagram for explaining the effect of the variable gain amplification circuit-according to the first embodiment. To be specific, FIG. 4 plots tertiary distortion intercept points (IIP3) against gain setting in a case where a desired RF signal of 1.01 GHz and an interference wave signal of 1.05 GHz are supplied from the RF signal source 2 to the variable gain mixer 1 while an LO signal of 1 GHz is supplied from the LO signal source 3 to the variable gain mixer 1, and the mixer 1 outputs a desired IF signal of 10 MHz and an IM3 signal of 90 MHz that is not required. For comparison with the conventional variable gain amplification circuit, characteristics in the case where the variable capacitor 5 is fixed at 2 pF are also shown.

In this first embodiment, the resistances r1, r2, r3, and r4 shown in FIG. 2 are set at 2 kΩ, 6 kΩ, 3 kΩ, and 1 kΩ, respectively, and the capacitances c1, c2, c3, and c4 shown in FIG. 3 are set at 2 pF, 700 fF, 1.3 pF, and 4 pF, respectively.

At this time, the capacitance C5, resistance R7, and cutoff frequency fc depending on the state of the switch are as shown in table 1.

TABLE 1

| gain setting | state of switch | | | R7(kΩ) | C5(pF) | fc(MHz) |
| --- | --- | --- | --- | --- | --- | --- |
| | φ1 | φ2 | φ3 | | | |
| 0 (Max) | OFF | OFF | OFF | 2.0 | 2.0 | 20 |
| 1 | ON | OFF | OFF | 1.5 | 2.7 | |
| 2 | ON | ON | OFF | 1.0 | 4.0 | |
| 0 (Min) | ON | ON | ON | 0.5 | 8.0 | |

However, since the variable capacitor C5 according to the first embodiment is connected to the differential output terminal 4, it is equivalent to that a counter ground capacitor twice as large as the capacitor C5 is connected at one side.

In the conventional variable gain amplification circuit, since the capacitor having the fixed capacitance is employed, the cutoff frequency fc varies according to the gain setting of the variable gain mixer 1, resulting in degradation in distortion characteristics at the lower gain side. On the other hand, in the variable gain amplification circuit according to the first embodiment, the capacitance C5 of the variable capacitor 5 is controlled according to the gain setting so that the cutoff frequency fc is kept at 20 MHz as shown in table 1. Thereby, the IM3 signal of 90 MHz that is not required can be attenuated, and degradation in distortion characteristics at the lower gain side can be suppressed as shown in FIG. 4, in contrast to the conventional variable gain amplification circuit.

While in this first embodiment the fundamental construction of the variable gain mixer 1 is a single balanced mixer as shown in FIG. 1, the present invention is not restricted thereto. The fundamental construction of the variable gain mixer 1 may be a double balanced mixer, a dual gate mixer, a diode mixer, or the like.

While in this first embodiment the variable resistor 7 is a digital variable resistor comprising resistors and switches connected in parallel as shown in FIG. 3, the present invention is not restricted thereto. The variable resistor 7 may be constituted by elements or circuits that can control the resistance, such as a variable resistor comprising resistors and switches connected in series, a variable resistor comprising resistors and switches connected in parallel and resistors and switches connected in series, or a variable resistor that can vary resistance components of a transistor.

Further, while in this first embodiment the variable capacitor 5 is a digital variable capacitor comprising capacitors and switches connected in parallel as shown in FIG. 3, the present invention is not restricted thereto. The variable capacitor 5 may be constituted by arbitrary elements and circuits that can control the capacitance in combination together, such as a variable capacitor comprising capacitors and switches connected in series, a variable capacitor comprising resistors and switches connected in parallel and capacitors and switches connected in series, or a MOS capacitor.

As described above, according to the first embodiment of the invention, the capacitance C5 of the variable capacitor 5 is controlled by the control circuit 6 so that the cutoff frequency fc becomes constant, whereby degradation in distortion characteristics at low gain can be suppressed.

Embodiment 2

Figure 5:
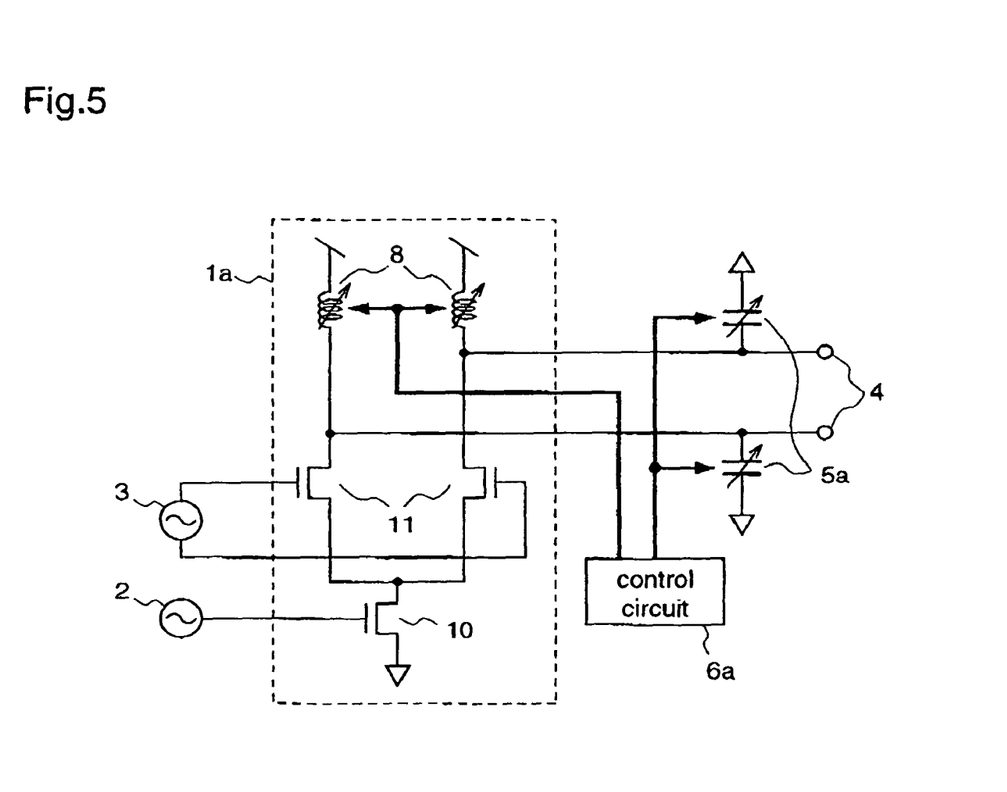
FIG. 5 is a circuit diagram of a variable gain amplification circuit according to a second embodiment of the present invention.

FIG. 5 is a circuit diagram illustrating the construction of a variable gain amplification circuit according to the second embodiment of the present invention.

In FIG. 5, reference numeral 1a denotes a variable gain mixer, numeral 2 denotes an RF signal source connected to a first input terminal of the variable gain mixer 1a, numeral 3 denotes an LO signal source connected to a second input terminal of the variable gain mixer 1a, numeral 4 denotes an output terminal, numeral 5a denotes a variable capacitor, and numeral 6a denotes a control circuit for controlling the gain of the variable gain mixer 1 and the capacitance of the variable capacitor 5a. In this second embodiment, the variable gain mixer 1a is a down conversion mixer.

Further, the variable gain mixer 1a is a single balanced mixer, comprising a variable inductor 8, an RF signal input transistor 10, and an LO signal input transistor 11.

Figure 6:
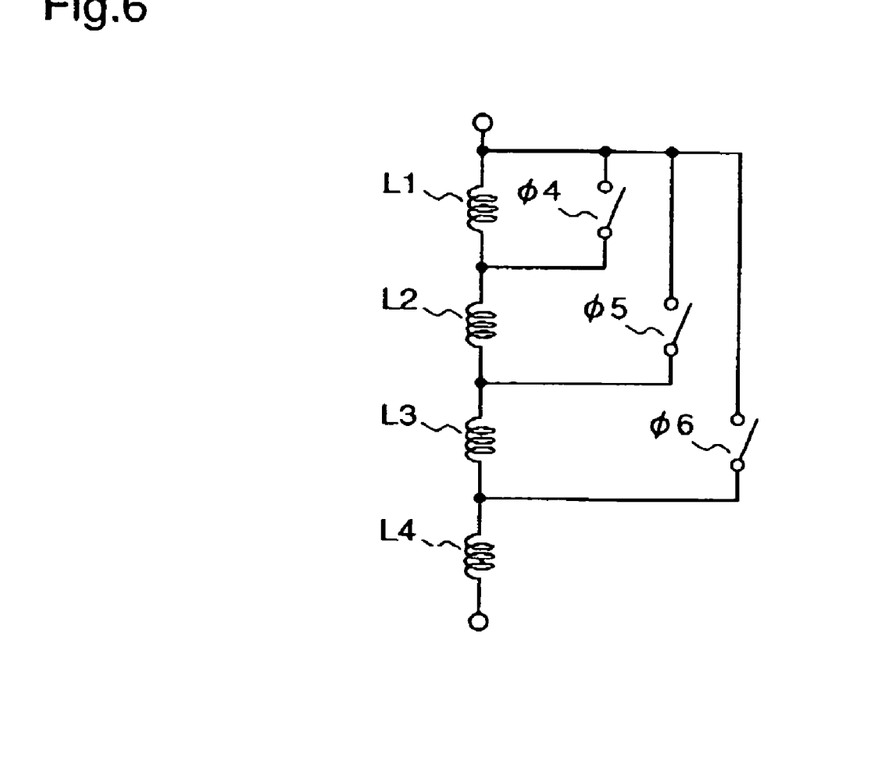
FIG. 6 is a circuit diagram illustrating a variable inductor included in the variable gain amplification circuit according to the second and fourth embodiments of the present invention.

The variable inductor 8 comprises four inductors L1, L2, L3, and L4 and three switches φ4, φ5, and φ6, and the inductance between the terminals can be changed by turning off all of the switches or turning on one of the switches.

Figure 7:
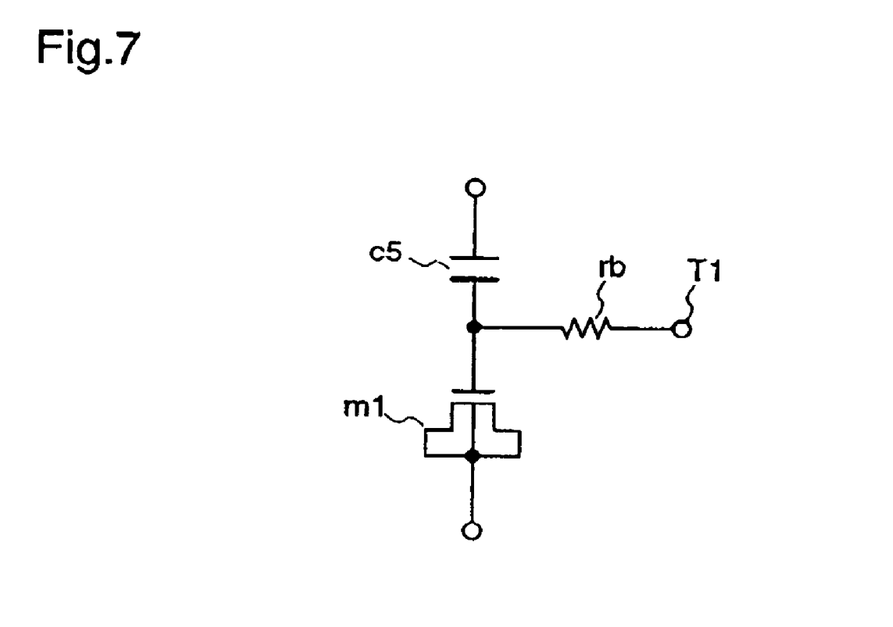
FIG. 7 is a circuit diagram illustrating a variable capacitor included in the variable gain amplification circuit according to the second and fourth embodiments of the present invention.

Further, as shown in FIG. 7, the variable capacitor 5a comprises a capacitor c5, a MOS device m1, a bias resistor rb, and a control terminal T1, and the capacitance between the terminals can be changed according to a bias voltage supplied to the control terminal T1.

Further, the RF signal source 2 comprises an antenna A1 and an LNA (Low Noise Amplifier) as shown in FIG. 19, and the LO signal source 3 comprises a PLL (Phase Locked Loop).

Hereinafter, the operation of the variable gain amplification circuit as constructed above will be described.

The RF signal supplied from the RF signal source 2 to the variable gain mixer 1a is input to the RF signal input transistor 10, and converted from a voltage signal to a current signal.

On the other hand, the differential LO signal supplied from the LO signal source 3 to the variable gain mixer 1a is input to the LO signal input transistor 11, and the LO signal input transistor 11 repeats the switching operation at the frequency of the LO signal.

When the voltage-to-current converted RF signal is input to the LO signal input transistor 11, the RF signal and the LO signal are multiplied. Thereby the RF signal is frequency-converted to be an IF signal, and further, the IF signal is converted into a voltage signal by the variable inductor 8, whereby the IF signal appears at the output terminal 4.

The variable gain function of the variable gain mixer 1a is realized by controlling the inductance L8 of the variable inductor 8 with the control circuit 6a.

Further, the capacitance C5 of the variable capacitor 5a is controlled so that the resonance frequency fr of the variable gain mixer 1a becomes constant, in synchronization with the variable inductor 8.

Next, the effect of the variable gain amplification circuit according to the second embodiment will be described in comparison with the conventional variable gain amplification circuit.

Figure 9:
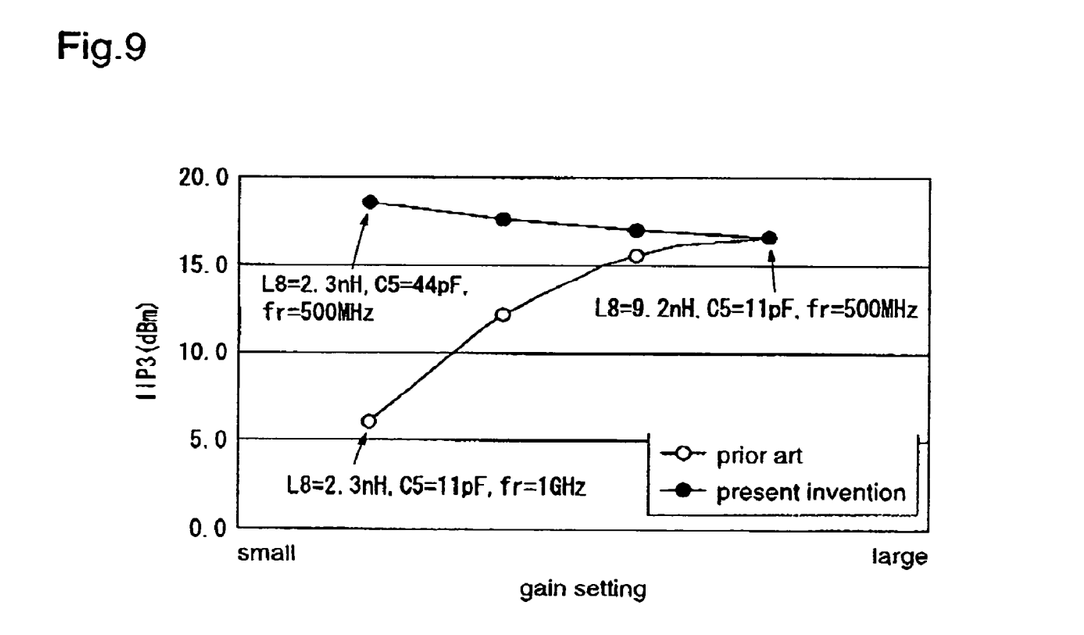
FIG. 9 is a diagram for explaining the variable gain amplification circuit according to the second embodiment of the present invention.

FIG. 9 is a diagram for explaining the effect of the variable gain amplification circuit according to the second embodiment. To be specific, FIG. 9 plots tertiary distortion intercept points (IIP3) against gain setting in a case where a desired RF signal of 1.5 GHz and an interference wave signal of 1.7 GHz are supplied from the RF signal source 2 to the variable gain mixer 1a while an LO signal of 1 GHz is supplied from the LO signal source 3 to the variable gain mixer 1a, and the mixer 1 outputs a desired IF signal of 500 MHz and an IM3 signal of 900 MHz that is not required. For comparison with the conventional variable gain amplification circuit, characteristics in the case where the variable capacitor 5 is fixed at 11 pF are also shown.

Figure 8:
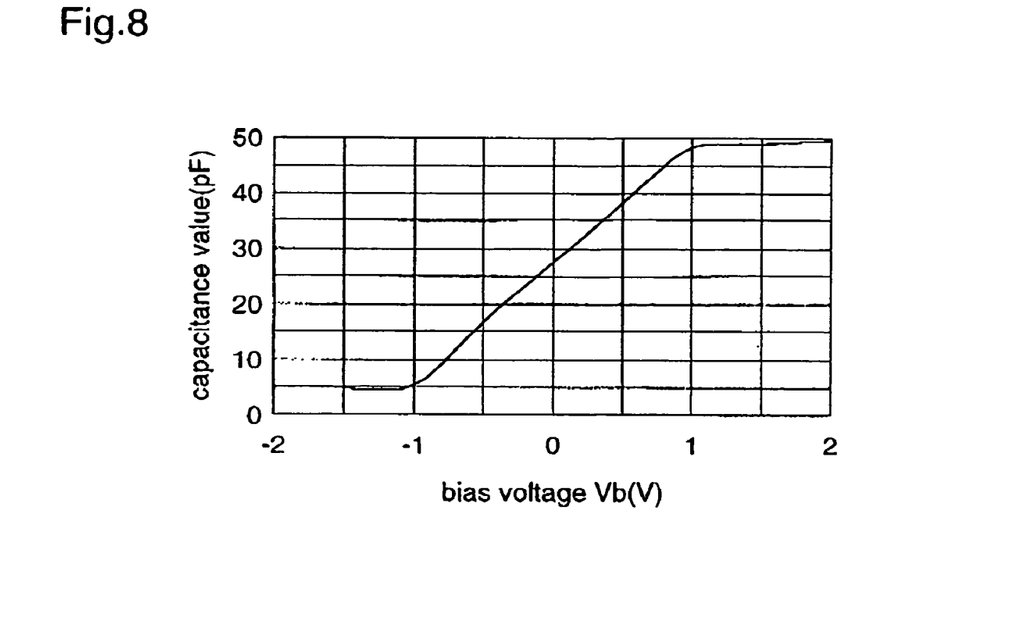
FIG. 8 is a diagram illustrating a capacitance against a bias voltage applied to the variable capacitor included in the variable gain amplification circuit according to the second and fourth embodiments of the present invention.

In this second embodiment, the inductances L1, L2, L3, and L4 shown in FIG. 6 are set at 2.3 nH, 2.3 nH, 2.3 nH, and 2.3 nH, respectively. Further, in FIG. 7, the capacitance c5 is set at 100 pF and the bias resistance rb is set at 100 kΩ, and the capacitance of the variable capacitor 5a can be varied as shown in FIG. 8 by a bias voltage Vb applied to the control terminal T1.

At this time, the capacitance C5, inductance L8, and resonance frequency fr depending on the state of the switch and the bias voltage Vb are as shown in table 2.

TABLE 2

| gain setting | state of switch φ4 | φ5 | φ6 | bias voltage Vb(V) | L8(nH) | C5(pF) | fr (MHz) |
|---|---|---|---|---|---|---|---|
| 0 (Max) | OFF | OFF | OFF | −0.75 | 9.2 | 11 | 500 |
| 1 | ON | OFF | OFF | −0.60 | 6.9 | 15 | |
| 2 | OFF | ON | OFF | −0.25 | 4.6 | 22 | |
| 0 (Min) | OFF | OFF | ON | 0.75 | 2.3 | 44 | |

In the conventional variable gain amplification circuit, since the capacitor having the fixed capacitance is employed, the resonance frequency fr varies according to the gain setting of the variable gain mixer 1a, resulting in degradation in distortion characteristics at the low gain side. On the other hand, in the variable gain amplification circuit according to the second embodiment, since, the capacitance C5 of the variable capacitor 5a is controlled according to the gain setting as shown in table 2, the cutout frequency fr is set at 500 MHz constantly.

Thereby, in the variable gain amplification circuit of the secured embodiment, the IM3 signal of 900 MHz that is not required can be attenuated, and degradation in distortion characteristics at the low gain side can be suppressed as shown in FIG. 9, in contrast to the conventional variable gain amplification circuit.

While in this second embodiment the fundamental construction of the variable gain mixer 1a is a single balanced mixer as shown in FIG. 1, the present invention is not restricted thereto. The fundamental construction of the variable gain mixer 1 may be a double balanced mixer, a dual gate mixer, a diode mixer, or the like.

While in this second embodiment the variable inductor 8 is a digital variable inductor comprising serial-connected inductors and switches as shown in FIG. 6, the present invention is not restricted thereto. The variable inductor 8 may be constituted by arbitrary elements and circuits that can control the inductance in combination together, such as a variable inductor comprising inductors and switches connected in parallel, or a variable inductor comprising inductors and switches connected in parallel and inductors and switches connected in series.

Further, while in this second embodiment the variable capacitor 5a is an analog variable capacitor comprising a MOS device as shown in FIG. 7, the present invention is not restricted thereto. The variable capacitor 5a may be constituted by arbitrary elements and circuits that can control the capacitance in combination together, such as a variable capacitor comprising capacitors and switches connected in series, a variable capacitor comprising capacitors and switches connected in parallel, or a variable capacitor comprising capacitors and switches connected in parallel and capacitors and switches connected in series.

As described above, according to the second embodiment of the invention, the capacitance C5 of the variable capacitor 5a controlled by the control circuit 6 so that the cutoff frequency fc becomes constant, whereby degradation in distortion characteristics at low gain can be suppressed.

Embodiment 3

Figure 10:
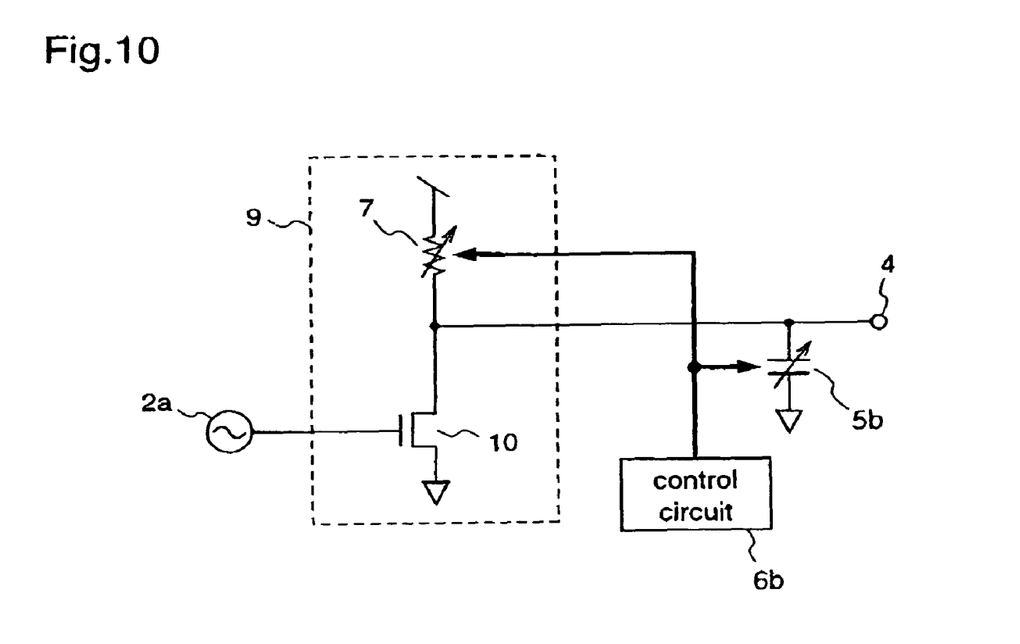
FIG. 10 is a circuit diagram illustrating a variable gain amplification circuit according to a third embodiment of the present invention.

FIG. 10 is a circuit diagram illustrating the construction of a variable gain amplification circuit according to the third embodiment of the present invention.

In FIG. 10, reference numeral 9 denotes a variable gain amplifier, numeral 2a denotes an RF signal source connected to a first input terminal of the variable gain amplifier 9, numeral 4 denotes an output terminal, numeral 5b denotes a variable capacitor, and numeral 6b denotes a control circuit for controlling the gain of the variable gain amplifier 9 and the capacitance of the variable capacitor 5b.

Further, the variable gain amplifier 9 is a source-grounded amplifier comprising a variable resistor 7, and an RF signal input transistor 10.

As shown in FIG. 2, the variable resistor 7 comprises four resistors r1, r2, r3, and r4, and three switches φ1, φ2, and φ3, and the resistance between the terminals can be changed by successively turning on the switches φ1 to φ3.

Further, as shown in FIG. 3, the variable capacitor 5a comprises four capacitors c1, c2, c3, and c4, and three switches φ1, φ2, and φ3, and the capacitance between the terminals can be changed by successively turning on the switches φ1 to φ3.

Figure 20:
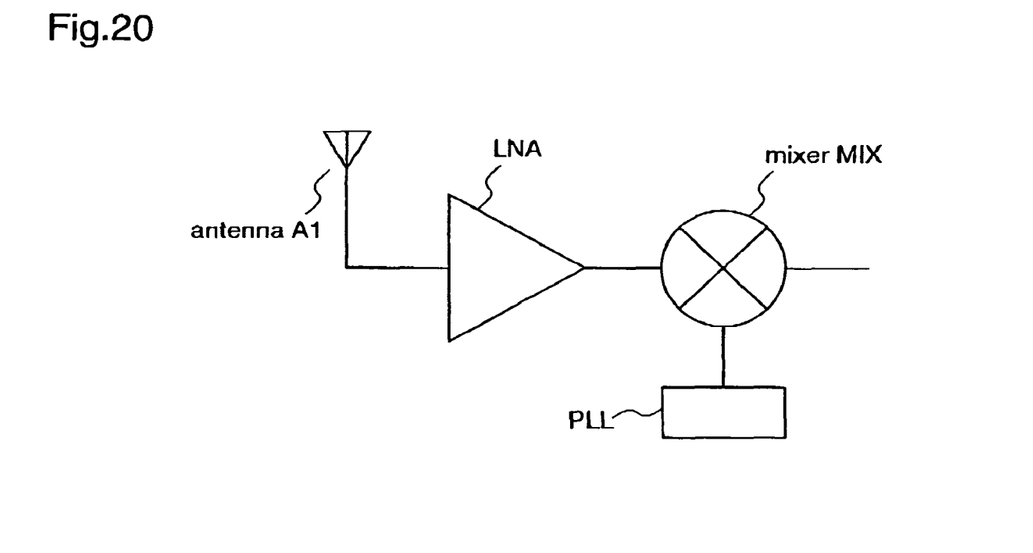
FIG. 20 is a block diagram illustrating an RF signal source according to the third embodiment of the present invention.

Further, the RF signal source 2a comprises an antenna A1, an LNA (Low Noise Amplifier), a mixer MIX, and a PLL as shown in FIG. 20.

Hereinafter, the operation of the variable gain amplification circuit constituted as described above will be described.

The RF signal supplied from the RF signal source 2a to the variable gain amplifier 9 is input to the RF signal input transistor 10, and converted from a voltage signal to a current signal. Then, the voltage-to-current converted RF signal is converted into a voltage signal by the variable resistor 7, whereby the RF signal whose signal amplitude is amplified or attenuated appears at the output terminal 4.

The variable gain function of the variable gain amplifier 9 is realized by controlling the resistance R7 of the variable resistor 7 with the control circuit 6b.

Further, the capacitance C5 of the variable capacitor 5b is controlled by the control circuit 6 so that the cutoff frequency fc of the variable gain amplifier 9 becomes constant, in synchronization with the variable resistor 7.

Next, the effect of the variable gain amplification circuit according to the third embodiment will be described in comparison with the conventional variable gain amplification circuit.

Figure 11:
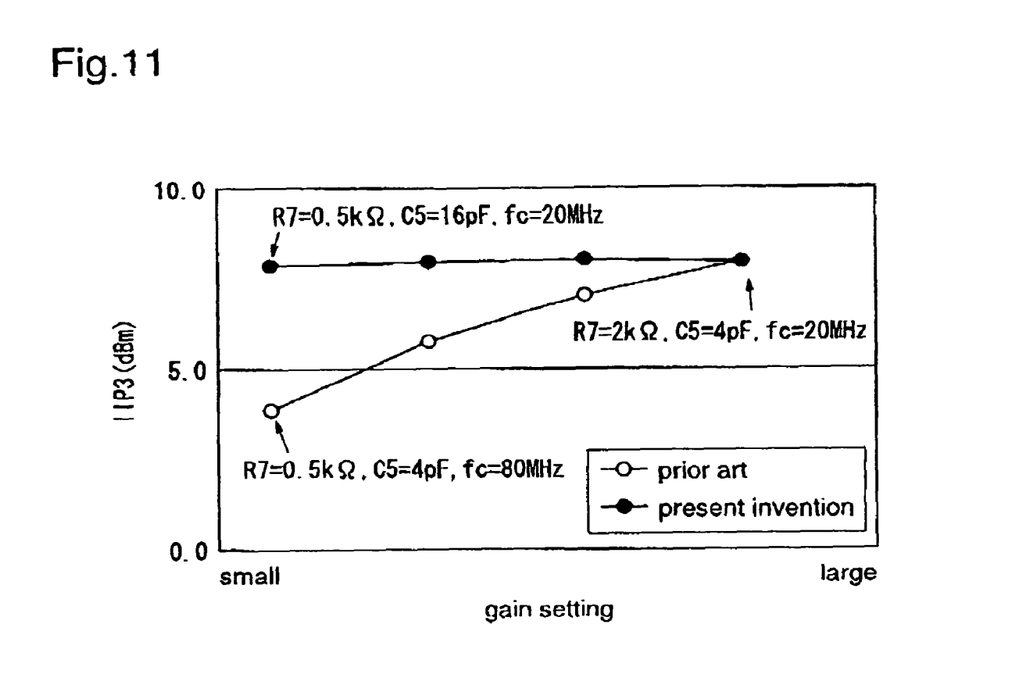
FIG. 11 is a diagram for explaining the effect of the variable gain amplification circuit according to the third embodiment.

FIG. 11 is a diagram for explaining the effect of the variable gain amplifier according to the third embodiment. To be specific, FIG. 11 plots tertiary distortion intercept points (IIP3) against gain setting in a case where a desired RF signal of 10 GHz and an interference wave signal of 50 MHz are supplied from the RF signal source 2a to the variable gain amplifier 9, and the amplifier 9 outputs a desired IF signal of 10 MHz and an IM3 signal of 90 MHz that is not required. For comparison with the conventional variable gain amplification circuit, characteristics in the case where the variable capacitor 5b is fixed at 4 pF are also shown.

In this third embodiment, the resistances r1, r2, r3, and r4 shown in FIG. 2 are set at 2 kΩ, 6 kΩ, 3 kΩ, and 1 kΩ, respectively, and the capacitances c1, c2, c3, and c4 shown in FIG. 3 are set at 4 pF, 1.4 pF, 2.6 pF, and 8 pF, respectively.

At this time, the capacitance C5, resistance R7, and cutoff frequency fc depending on the state of the switches are as shown in table 1.

TABLE 3

| gain setting | state of switch | | | R7(kΩ) | C5(pF) | fc(MHz) |
| --- | --- | --- | --- | --- | --- | --- |
|  | φ1 | φ2 | φ3 |  |  |  |
| 0 (Max) | OFF | OFF | OFF | 2.0 | 4.0 | 20 |
| 1 | ON | OFF | OFF | 1.5 | 5.4 |  |

TABLE 3-continued

| gain setting | state of switch | | | R7(kΩ) | C5(pF) | fc(MHz) |
| --- | --- | --- | --- | --- | --- | --- |
|  | φ1 | φ2 | φ3 |  |  |  |
| 2 | ON | ON | OFF | 1.0 | 8.0 |  |
| 0 (Min) | ON | ON | ON | 0.5 | 16.0 |  |

In the conventional variable gain amplification circuit, since the capacitor having the fixed capacitance is employed, the cutoff frequency fc varies according to the gain setting of the variable gain amplifier 9, resulting in degradation in distortion characteristics at the low gain side. On the other hand, in the variable gain amplification circuit according to the third embodiment, as shown in table 3, the capacitance C5 of the variable capacitor 5 is controlled according to the gain setting so that the cutoff frequency fc is dept at 20 MHz. Thereby, the IM3 signal of 90 Mhz that is not required can be attenuated, and degradation in distortion characteristics at the lower gain side can be suppressed as shown in FIG. 11, in contrast to the conventional variable gain amplification circuit.

While in this third embodiment the fundamental construction of the variable gain amplifier 9 is a source-grounded amplifier as shown in FIG. 10, the present invention is not restricted thereto. The fundamental construction of the variable gain amplifier 9 may be a gate-grounded amplifier, a differential amplifier, or the like.

While in this third embodiment the variable resistor 7 is a digital variable resistor comprising resistors and switches connected in parallel as shown in FIG. 2, the present invention is not restricted thereto. The variable resistor 7 may be constituted by arbitrary elements and circuits that can control the resistance in combination together, such as a variable resistor comprising resistors and switches connected in series, a variable resistor comprising resistors and switches connected in parallel and resistors and switches connected in series, or a variable resistor that can vary resistance components of a transistor.

Further, while in this third embodiment the variable capacitor 5b is a digital variable capacitor comprising capacitors and switches connected in parallel as shown in FIG. 3, the present invention is not restricted thereto. The variable capacitor 5b may be constituted by arbitrary elements and circuits that can control the capacitance in combination together, such as a variable capacitor comprising capacitors and switches connected in series, a variable capacitor comprising capacitors and switches connected in parallel and capacitors and switches connected in series, or a MOS capacitor.

As described above, according to the third embodiment of the invention, the capacitance C5 of the variable capacitor 5b is controlled by the control circuit 6 so that the cutoff frequency fc becomes constant, whereby degradation in distortion characteristics at low gain can be suppressed.

Embodiment 4

Figure 12:
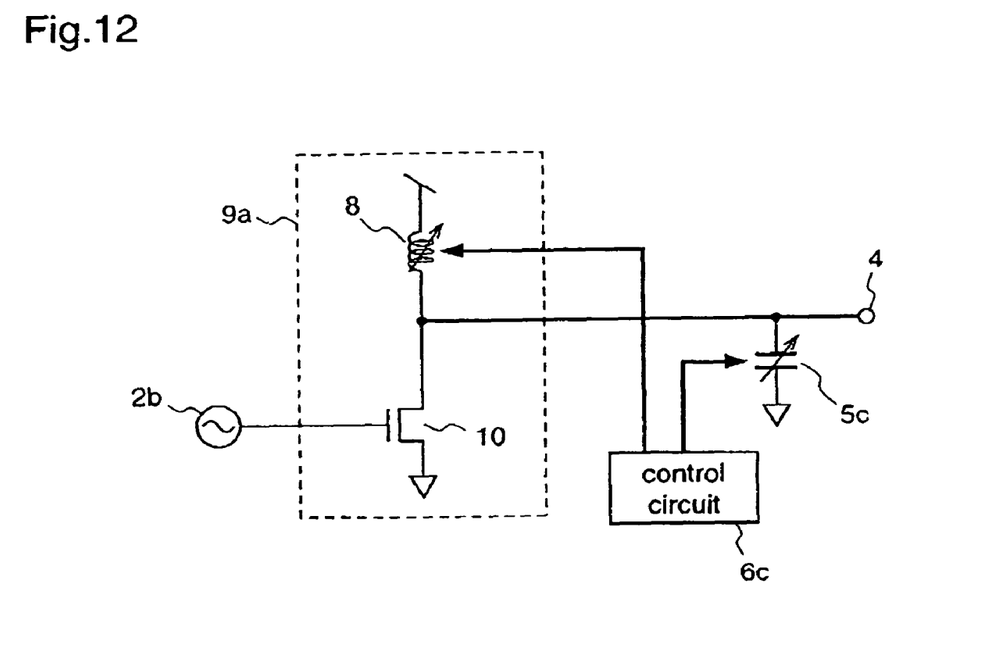
FIG. 12 is a circuit diagram illustrating a variable gain amplification circuit according to the fourth embodiment of the present invention.

FIG. 12 is a circuit diagram illustrating the construction of a variable gain amplification circuit according to a fourth embodiment of the present invention.

In FIG. 12, reference numeral 9a denotes a variable gain amplifier, numeral 2b denotes an RF signal source connected to a first input terminal of the variable gain amplifier 9a, numeral 4 denotes an output terminal, numeral 5c denotes a variable capacitor, and numeral 6c denotes a control circuit for controlling the gain of the variable gain amplifier 9 and the capacitance of the variable capacitor 5c.

Further, the variable gain amplifier 9a is a source-grounded amplifier comprising a variable inductor 8, and an RF signal input transistor 10.

As shown in FIG. 6, the variable inductor 8 comprises four inductors L1, L2, L3, and L4 and three switches φ4, φ5, and φ6, and the inductance between the terminals can be changed by turning off all of the switches or turning on one of the switches.

Further, as shown in FIG. 7, the variable capacitor 5a comprises a capacitor c5, a MOS device m1, a bias resistor rb, and a control terminal T1, and the capacitance between the terminals can be changed according to a bias voltage supplied to the control terminal T1.

Further, the RF signal source 2b comprises an antenna A1.

Hereinafter, the operation of the variable gain amplification circuit as constructed above will be described.

The RF signal supplied from the RF signal source 3 to the variable gain mixer 1a is input to the RF signal input transistor 10, and converted from a voltage signal to a current signal. Then, the voltage-to-current converted RF signal is converted into a voltage signal by the variable inductor 8, whereby the RF signal whose signal amplitude is amplified or attenuated appears at the output terminal 4.

The variable gain function of the variable gain amplifier 9a is realized by controlling the inductance L8 of the variable inductor 8 with the control circuit 6c.

Further, the capacitance C5 is controlled so that the resonance frequency fr of the variable gain amplifier 9a becomes constant, in synchronization with the variable inductor 8.

Next, the effect of the variable gain amplification circuit according to the fourth embodiment will be described in comparison with the conventional variable gain amplification circuit.

Figure 13:
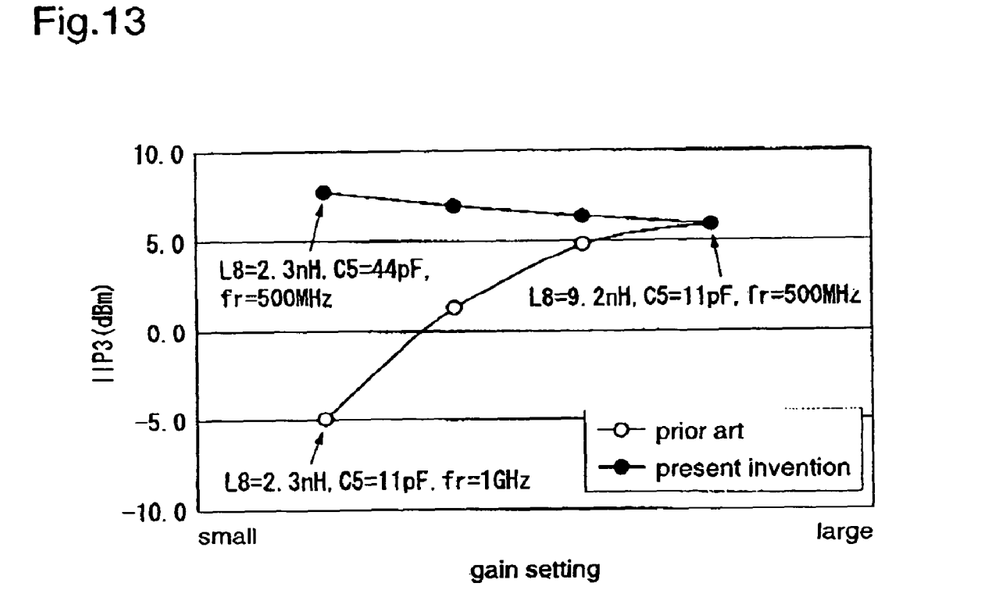
FIG. 13 is a diagram for explaining the effect of the variable gain amplification circuit according to the fourth embodiment of the present invention.

FIG. 13 is a diagram for explaining the effect of the variable gain amplification circuit according to the fourth embodiment. To be specific, FIG. 13 plots tertiary distortion intercept points (IIP3) against gain setting in a case where a desired RF signal of 500 MHz and an interference wave signal of 700 MHz are supplied from the RF signal source 2b to the variable gain amplifier 9a, and the amplifier 9a outputs a desired signal of 500 MHz and an IM3 signal of 900 Mhz that is not required. For comparison with the conventional variable gain amplification circuit, characteristics in the case where the variable capacitor 5 is fixed at 11 pF are also shown.

In this fourth embodiment, the inductances L1, L2, L3, and L4 shown in FIG. 6 are set at 2.3 nH, 2.3 nH, 2.3 nH, and 2.3 nH, respectively. Further, in FIG. 7, the capacitance c5 is set at 100 pF and the bias resistance rb is set at 100 kΩ, and the capacitance of the variable capacitor 5c can be varied as shown in FIG. 8 by a bias voltage Vb applied to the control terminal T1.

At this time, the capacitance C5, inductance L8, and resonance frequency fr depending on the state of the switch and the bias voltage Vb are as shown in table 2.

In the conventional variable gain amplification circuit, since the capacitor having the fixed capacitance is employed, the resonance frequency fr varies according to the gain setting of the variable gain mixer 1a, resulting in degradation in distortion characteristics at the low gain side. On the other hand, in the variable gain amplification circuit according to the fourth embodiment, since the capacitance c5 of the variable capacitor 5c is controlled according to the gain setting as shown in table 2, the cutoff frequency fr is constantly kept at 500 MHz. Accordingly, in the variable gain amplification circuit of the fourth embodiment, the IM3 signal of 900 MHz that is not required can be attenuated, and degradation in distortion characteristics at the low gain side can be suppressed as shown in FIG. 9, in contrast to the conventional variable gain amplification circuit.

While in this fourth embodiment the fundamental construction of the variable gain amplifier 9a is a source-grounded amplifier as shown in FIG. 12, the present invention is not restricted thereto. The fundamental construction of the variable gain amplifier 9a may be a gate-grounded amplifier, a differential amplifier, or the like.

While in this fourth embodiment the variable inductor 8 is a digital variable inductor comprising inductors and switches connected in series as shown in FIG. 6, the present invention is not restricted thereto. The variable inductor 8 may be constituted by arbitrary elements and circuits that can control the inductance in combination together, such as a variable inductor comprising inductors and switches connected in parallel, or a variable inductor comprising inductors and switches connected in parallel and inductors and switches connected in series.

Further, while in this fourth embodiment the variable capacitor 5c is an analog variable capacitor comprising a MOS device as shown in FIG. 7, the present invention is not restricted thereto. The variable capacitor 5c may be constituted by arbitrary elements and circuits that can control the capacitance in combination together, such as a variable capacitor comprising capacitors and switches connected in series, a variable capacitor comprising capacitors and switches connected in parallel, or a variable capacitor comprising capacitors and switches connected in parallel and capacitors and switches connected in series.

As described above, according to the fourth embodiment of the invention, the capacitance C5 of the variable capacitor 5c is controlled by the control circuit 6 so that the cutoff frequency fc becomes constant, whereby degradation in distortion characteristics can be suppressed.

As described above, in the variable gain amplification circuit according to the present invention, since the capacitance of the variable capacitor that is connected to the output terminal of the variable gain mixer or the variable gain amplifier is controlled according to the gain setting, degradation in distortion characteristics at low gain can be suppressed.

What is claimed is:

1. A variable gain amplification circuit comprising:
   a gain-variable signal generator comprising a variable resistor and an output terminal, said variable resistor comprising a plurality of selectable resistors, wherein a resistance value of said variable resistor is controlled by controlling a first switching unit so as to select a resistor of said plurality of selectable resistors;
   a variable capacitor connected between said output terminal and an AC grounded terminal, said variable capacitor comprising a plurality of selectable capacitors, wherein a capacitance value of said variable capacitor is controlled by controlling a second switching unit so as to select a capacitor of said plurality of selectable capacitors; and
   a control circuit operable to control said first switching unit and said second switching unit so as to control the capacitance value of said variable capacitor and the resistance value of said variable resistor,
   wherein said control circuit controls the capacitance value of said variable capacitor by controlling on/off action of said first switching unit according to the resistance value of said variable resistor.

2. A variable gain amplification circuit as defined in claim 1, wherein said gain-variable signal generator comprises:
   a variable gain mixer having a first input terminal and a second input terminal;

an RF signal source connected to said first input terminal of said variable gain mixer; and an LO signal source connected to said second input terminal of said variable gain mixer.

3. A variable gain amplification circuit as defined in claim 1, wherein said gain-variable signal generator comprises:

a variable gain amplifier having a first input terminal; and an RF signal source connected to the first input terminal of the variable gain amplifier.

4. A variable gain amplification circuit comprising:

a gain-variable signal generator having an output load part comprising a variable resistor and an output terminal, said variable resistor comprising a plurality of selectable resistors, wherein a resistance value of said variable resistor is controlled by controlling a first switching unit so as to select a resistor of said plurality of selectable resistors;

a variable capacitor connected between said output terminal and an AC grounded terminal, said variable capacitor comprising a plurality of selectable capacitors, wherein a capacitance value of said variable capacitor is controlled by controlling a second switching unit so as to select a capacitor of said plurality of selectable capacitors; and a control means for controlling the capacitance value of said variable capacitor and the resistance value of said variable resistor by controlling said first switching unit and said second switching unit, wherein the capacitance value of said variable capacitor is controlled according to the resistance value of said variable resistor.

5. A variable gain amplification circuit as defined in claim 4, wherein said gain-variable signal generator comprises:

a variable gain mixer having a first input terminal and a second input terminal;

an RF signal source connected to said first input terminal of said variable gain mixer; and an LO signal source connected to said second input terminal of said variable gain mixer.

6. A variable gain amplification circuit as defined in claim 4, wherein said gain-variable signal generator comprises:

a variable gain amplifier having a first input terminal; and an RF signal source connected to the first input terminal of the variable gain amplifier.

7. A variable gain amplification circuit as defined in claim 1, wherein said variable capacitor includes a circuit comprising at least two capacitors placed in parallel, and wherein said second switching unit includes at least one switch connected to an end of one of said at least two capacitors.

8. A variable gain amplification circuit as defined in claim 1, wherein said variable resistor includes a circuit comprising at least two resistors placed in parallel, and wherein said first switching unit includes at least one switch connected to an end of one of said at least two resistors.

* * * * *